United States Patent
Goodner et al.

(10) Patent No.: US 7,466,025 B2
(45) Date of Patent: Dec. 16, 2008

(54) FORMATION OF INTERCONNECT STRUCTURES BY REMOVING SACRIFICIAL MATERIAL WITH SUPERCRITICAL CARBON DIOXIDE

(75) Inventors: Michael D. Goodner, Hillsboro, OR (US); Jihperng Leu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 182 days.

(21) Appl. No.: 11/106,929

(22) Filed: Apr. 14, 2005

(65) Prior Publication Data

US 2005/0179140 A1 Aug. 18, 2005

Related U.S. Application Data

(62) Division of application No. 10/301,976, filed on Nov. 21, 2002, now Pat. No. 6,924,222.

(51) Int. Cl.
*H01L 23/48* (2006.01)
*H01L 23/52* (2006.01)
*H01L 29/40* (2006.01)

(52) U.S. Cl. .................. 257/750; 257/758; 257/760

(58) Field of Classification Search ............ 257/632, 257/750–776
See application file for complete search history.

(56) References Cited

U.S. PATENT DOCUMENTS

| | | | | |
|---|---|---|---|---|
| 5,668,398 A | * | 9/1997 | Havemann et al. | 257/522 |
| 6,004,521 A | * | 12/1999 | Miyoshi et al. | 423/213.5 |
| 6,306,754 B1 | | 10/2001 | Agarwal | |
| 6,448,177 B1 | | 9/2002 | Morrow et al. | |
| 6,451,712 B1 | * | 9/2002 | Dalton et al. | 438/781 |
| 6,541,066 B1 | * | 4/2003 | Geus | 427/226 |
| 6,734,094 B2 | | 5/2004 | Kloster et al. | |
| 6,861,332 B2 | | 3/2005 | Park et al. | |
| 6,867,125 B2 | | 3/2005 | Kloster et al. | |
| 2002/0127844 A1 | | 9/2002 | Grill et al. | |
| 2003/0168747 A1 | | 9/2003 | Hussein et al. | |
| 2004/0061230 A1 | | 4/2004 | Powers et al. | |
| 2004/0102031 A1 | | 5/2004 | Kloster et al. | |

OTHER PUBLICATIONS

Ueda, T. et al., A Novel Air Gap IntegrationScheme for Multi-level Interconnects Using Self-Aligned Via Plugs, 1998 Symposium on VLSI Technology Digest of Technical Papers, pp. 46-47.
Kohl, P.A., et al. "Air Gaps in 0.3 um Electrical Interconnections", 2000 IEEE Electron Device Letters, vol. 21, No. 12, Dec. 2000, pp. 557-559.
Leu et al., U.S. Appl. No. 10/302,073, filed Nov. 21, 2002.

* cited by examiner

*Primary Examiner*—Cuong Q Nguyen
(74) *Attorney, Agent, or Firm*—Blakely, Sokoloff, Taylor & Zafman LLP

(57) ABSTRACT

An inter-layer dielectric structure and method of making such structure are disclosed. A composite dielectric layer comprising a porous matrix, as well as a porogen in certain variations, is formed adjacent a sacrificial dielectric layer. Subsequent to other processing treatments, a portion of the sacrificial dielectric layer is decomposed and removed through a portion of the porous matrix using supercritical carbon dioxide leaving voids in positions previously occupied by portions of the sacrificial dielectric layer. The resultant structure has a desirably low k value as a result of the voids and materials comprising the porous matrix and other structures. The composite dielectric layer may be used in concert with other dielectric layers of varying porosity, dimensions, and material properties to provide varied mechanical and electrical performance profiles.

25 Claims, 7 Drawing Sheets

FORMATION OF INTERCONNECT STRUCTURES BY REMOVING SACRIFICIAL MATERIAL WITH SUPERCRITICAL CARBON DIOXIDE

This is a Divisional Application of Ser. No.: 10/301,976 filed Nov. 21, 2002 now U.S. Pat. No. 6,924,222.

BACKGROUND OF THE INVENTION

Low dielectric constant materials are used as interlayer dielectrics in microelectronic devices, such as semiconductor devices, to reduce the RC delay and improve device performance. As device sizes continue to shrink, the dielectric constant of the material between metal lines must also decrease to maintain the improvement. Certain low-k materials have been proposed, including various carbon-containing materials such as organic polymers and carbon-doped oxides. Although such materials may serve to lower the dielectric constant, they may offer inferior mechanical properties such as poor strength and low fracture toughness. The eventual limit for a dielectric constant is k=1, which is the value for a vacuum. Methods and structures have been proposed to incorporate void spaces or "air gaps" using, for example, sacrificial materials, in attempts to obtain dielectric constants closer to k=1. One major issue facing such technologies is how to remove sacrificial material from relatively small or relatively large volumes to facilitate multi-layer structures with voids. Another major issue facing such technology is how to facilitate void creation while providing a structure which can withstand modern processing treatments, such as chemical-mechanical polishing and thermal treatment, as well as post processing mechanical and thermo-mechanical rigors.

Accordingly, there is a need for a microelectronic structure incorporating voids which has low-k dielectric properties, can be used in multi-layer structures, and has acceptable mechanical characteristics during and after processing.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

This invention involves the use of supercritical carbon dioxide (also denominated "supercritical $CO_2$" or "sc$CO_2$") to remove at least a portion of the material comprising the sacrificial dielectric layer, subsequent to other process treatments such as electroplating or planarization which may be facilitated by the presence of intact dielectric layers. The sacrificial layer may be positioned adjacent another dielectric layer which is also modified upon exposure to supercritical $CO_2$. An example scenario is depicted in brief in FIGS. 1A and 1B.

Figure 1A:
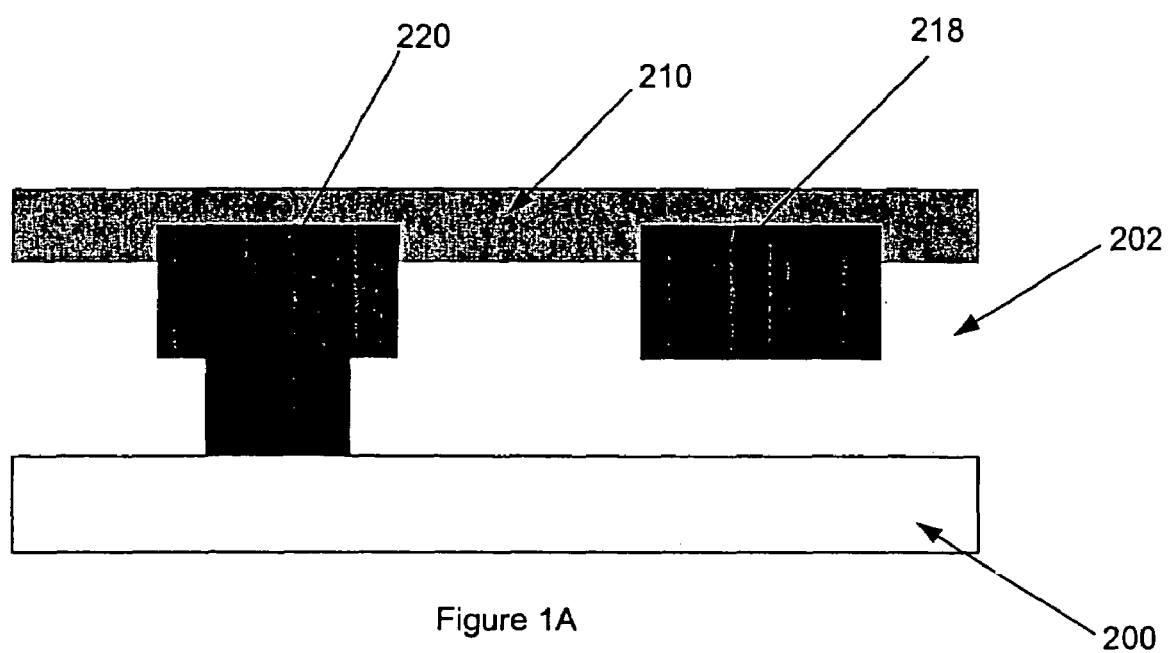
FIGS. 1A-1B depict cross-sectional views of various aspects of one embodiment of the present invention incorporating a sacrificial dielectric layer soluble in supercritical carbon dioxide.

Referring to FIG. 1A, a substrate layer (200) is depicted adjacent a sacrificial dielectric layer (202). The sacrificial dielectric layer (202) is positioned between the substrate layer (200) and a second dielectric layer (210), and is at least partially crossed by two conductive layers (218, 220), one of which (220) is shown completely crossing the sacrificial dielectric layer (202) to form an electrical connection across the sacrificial dielectric layer, as is commonly seen in microelectronic interconnects. The dielectric materials comprising the sacrificial dielectric layer (202) and the second dielectric layer (210) provide structural support which assists in maintaining the position of the conductive layers (218, 220), and provide load distribution and resistance as forces are applied to adjacent layers, such as during planarization. While such support is desirable for mechanical reasons, it can be related to decreased dielectric performance, as compared with dielectric layers comprising, at least in part, air gaps or voids. To increase dielectric performance, voids are created in the sacrificial layer, and in other embodiments, in the second dielectric layer, subsequent to processing treatments which may require or be facilitated by the mechanical support provided by completely intact layers.

Figure 1B:
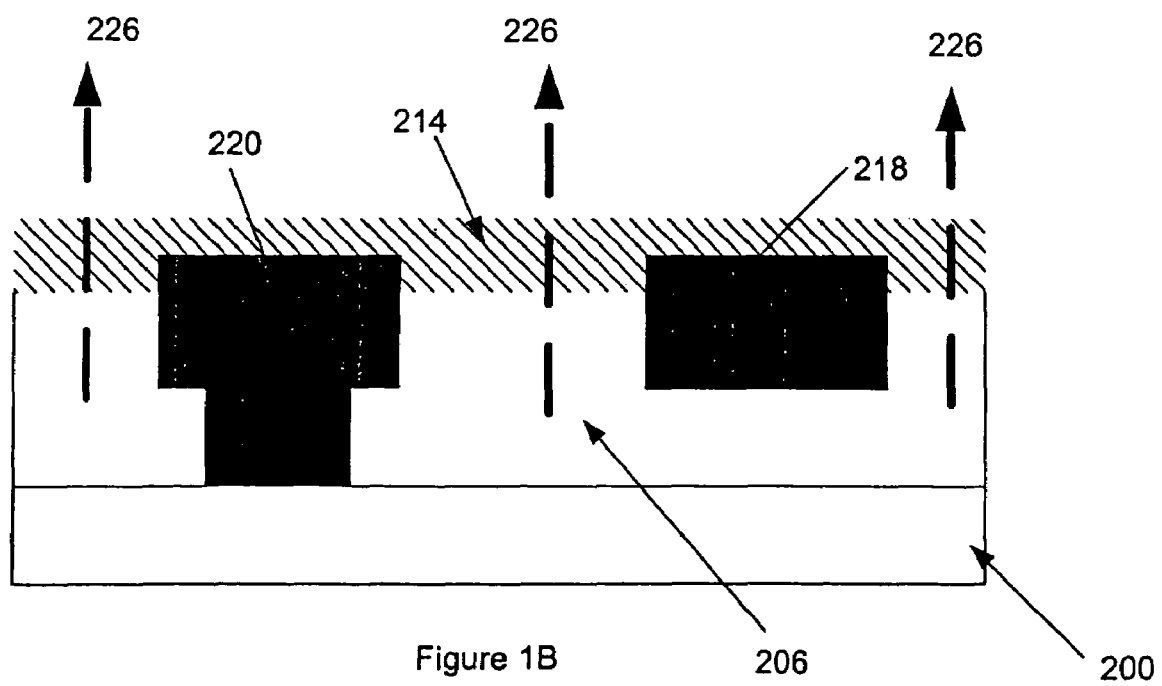

Referring to FIG. 1B, a version of the structure previously depicted in FIG. 1A is shown, this variation having improved dielectric properties provided by at least one void positioned in the volume (206) previously occupied by the sacrificial dielectric layer, and a modified second dielectric layer (214) also defining voids, the voids in each of these layers being created as a result of exposure to supercritical carbon dioxide, or supercritical carbon dioxide and co-solvents. For nomenclature efficiency, in the term "supercritical carbon dioxide" is used in reference to both supercritical carbon dioxide and co-solvents of supercritical carbon dioxide, as would be known to one skilled in the art. Supercritical carbon dioxide, known to penetrate small geometries and absorb and transport decomposed materials, may also be used to remove porogen decompositions within the second dielectric layer (210). The use of supercritical carbon dioxide requires fairly high pressures, in the range of 1,071 p.s.i. to reach the critical point of carbon dioxide, and special process equipment and environments, as is convention to those skilled in the art. To clarify the simplified terminology used herein as associated with the thermal or chemical break-down of sacrificial materials for subsequent removal, references to "decompositions" and "decomposing" comprise reference to "dissolving" and "dissolution" as well, or more simply, "break-down" by thermal or chemical means. The novel process and structures associated with conversion between structures such as those of FIGS. 1A and 1B are illustrated in further detail in FIGS. 2A-2J. It is important to note that while a damascene type process is illustrated in FIGS. 2A-2J, wherein the conductive layer is formed into trenches using electroplating techniques, the dielectric aspect of the invention, illustrated in summary fashion with the transformation from structures like that of FIG. 2C to structures like that of FIG. 2D, may be similarly applied to structures formed using other conventional techniques for forming conductive layers, such as subtractive metallization, given that the appropriate materials are in place as further described below. As would be apparent to one skilled in the art, subtractive metallization may involve formation of adjacent dielectric layers after formation of conductive layers, and the geometries of conductive layers formed may vary from those available with electroplating processes such as dual damascene.

Figure 2A:
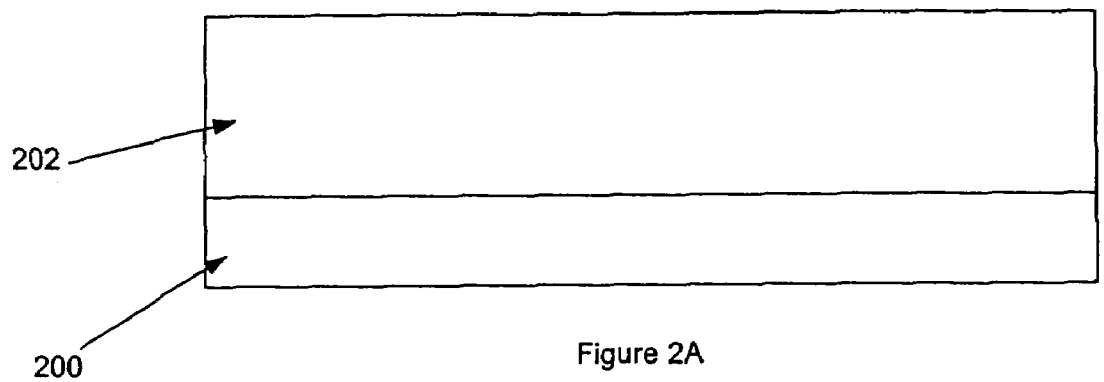
FIGS. 2A-2J depict cross-sectional views of various aspects of a related embodiment of the present invention incorporating a sacrificial dielectric layer soluble in supercritical carbon dioxide.

Referring to FIG. 2A, a substrate layer (200) is shown, upon which a sacrificial dielectric layer (202) has been formed. The substrate layer (200) may be any surface generated when making an integrated circuit or microelectronic device, upon which a conductive layer may be formed. The substrate layer (200) thus may comprise, for example, active and passive devices that are formed on a silicon wafer, such as transistors, capacitors, resistors, diffused junctions, gate electrodes, local interconnects, etcetera. The substrate layer (200) may also comprise insulating materials (e.g., silicon dioxide, either undoped or doped with phosphorus or boron and phosphorus; silicon nitride; silicon oxynitride; or a polymer) that separate active and passive devices from the conductive layer or layers that are formed adjacent them, and may comprise other previously formed conductive layers. The sacrificial dielectric layer (202) comprises a dielectric material substantially soluble in supercritical carbon dioxide, such as a highly-fluorinated or siloxane-based polymer dielectric material, many of which are commonly used in semiconductor processing. Example dielectric materials soluble in supercritical carbon dioxide include, but are not limited to, poly(vinylidene fluoride), poly(tetrafluoroethylene), perfluoropolyethers, perfluoro(meth)acrylates, poly(dimethyl siloxane), and highly-branched poly(perfluorooctylacrylate) ("pFOA"). These dielectric materials may be applied by various methods, depending on the chemistry of the material: spin-casting out of solution, evaporative deposition, physical vapor deposition, or chemical vapor deposition. The sacrificial dielectric layer (202) may be deposited in thicknesses preferably between about 10 nanometers to about 2000 nanometers. Additionally, co-solvents and reagents may be used to increase the solubility of some dielectric materials in scCO2 and extend the number of materials that can be used as the sacrificial dielectric material. These co-solvents and reagents include, but are not limited to, aprotic solvents (e.g., acetone, N-methyl pyrrolidinone, dimethyl sulfide, and dimethyl sulfoxide), protic solvents (e.g., water, methanol, or higher alcohols), organic solvents (e.g., hexanes), and reagents which attack the sacrificial dielectric material (e.g., hydrogen fluoride).

Figure 2B:
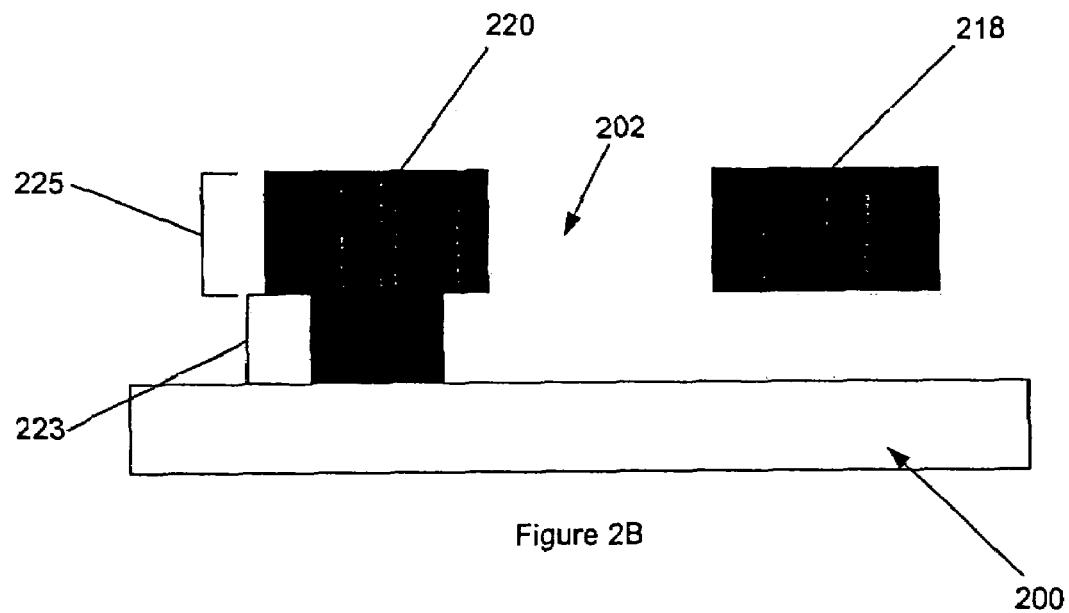

Referring to FIG. 2B, two conductive layers (218, 220) have been added to the structure of FIG. 2A. Each of the conductive layers (218, 220), comprising materials conventionally used to form conductive layers in integrated circuits, and preferably comprising metals such as copper, aluminum, and alloys thereof, is formed using known techniques. For example, the second depicted conductive layer (220) is formed using known dual damascene techniques, wherein a trench is formed using conventional lithography, etching, and cleaning techniques, the trench having a via portion (223) and a line portion (225), the line portion having a width varying from about 10 nanometers to about 2000 nanometers. The trench may then be lined with a barrier layer (not shown) to isolate conductive material, after which the trench is filled with a conductive material using, for example, known electroplating, chemical vapor deposition, or physical deposition techniques, to form the conductive layer (220) shown. With copper metal conductive layers, a barrier layer comprising, for example, tantalum, tantalum nitride or tungsten, is effective for isolating the copper. Such barrier layers may be deposited using conventional techniques such as chemical vapor deposition, atomic layer deposition, or other techniques as would be apparent to those skilled in the art, preferably at a thickness between about 10 nanometers and about 50 nanometers. Known polymeric barrier layers may also be employed, subject to the requirement that they be selected from the subgroup of polymer barrier materials which have relatively good electromigration characteristics, and be substantially insoluble in supercritical carbon dioxide.

Similarly, the first depicted conductive layer (218) may be formed using damascene techniques, this example, however, not having a "via" portion extending toward the substrate layer (200). The resultant interconnect structure has conductive layers (218, 220) positioned between remaining portions of the sacrificial dielectric layer (202). Alternatively, conductive layers (218, 220) may be made from doped polysilicon or a silicide, e.g., a silicide comprising tungsten, titanium, nickel, or cobalt, using known techniques. Depending upon the selected conductive material, a shunt layer may be formed over the conductive layers using conventional techniques and materials, to isolate the conductive layers from subsequent treatments and materials. With copper metal conductive layers, a metal shunt layer comprising, for example, cobalt or tungsten, is effective for isolating the copper. The shunt material (not shown) may be deposited at a thickness between 5 nanometers and 100 nanometers, preferably between 10 nanometers and 50 nanometers, using conventional techniques such as chemical vapor deposition, subsequent to a planarization using known techniques such as chemical-mechanical planarization (hereinafter "CMP"). Shunt material deposited upon the exposed portions of the sacrificial dielectric layer (202) may be removed using subsequent CMP or etch back treatments, as would be apparent to those skilled in the art.

Figure 2C:
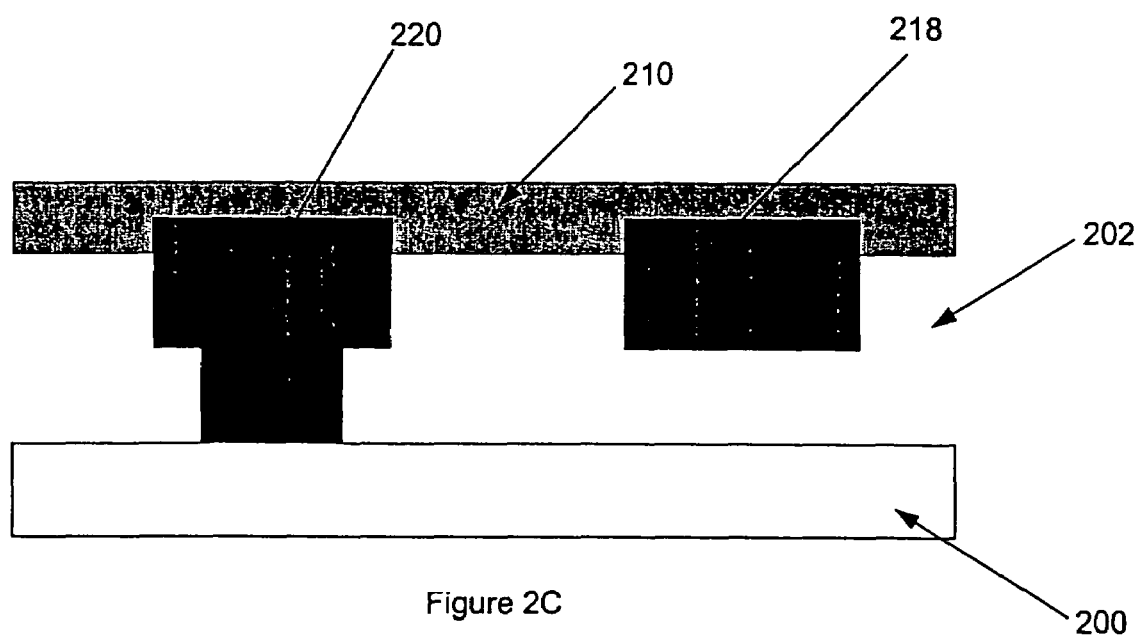

Referring to FIG. 2C, a structure similar to that of FIG. 2B is depicted, with the exception that a second dielectric layer (210) has been deposited adjacent the conductive layers (218, 220) and exposed portions of the sacrificial dielectric layer (202). To facilitate the introduction of supercritical carbon dioxide to the sacrificial dielectric layer (202), the second dielectric layer (210) may comprise a material through which supercritical carbon dioxide may transport to the sacrificial dielectric layer (202), such as a porous material having interconnected pores, or the second dielectric layer (210) may comprise a material, or materials in a composition formation, which may be transformed to provide such access to the sacrificial dielectric layer (202). The second dielectric layer (210) generally also must have electrically insulative properties, since it is positioned near a conductive layer and generally is not a preferred conduction pathway.

The second dielectric layer (210) preferably comprises a porous matrix having interconnected pores which provide a pathway sufficient for transport of decomposed portions of the sacrificial dielectric layer (202). In a related embodiment, the pores comprising such porous matrix material are at least partially occupied by a removable, or sacrificial, porogen, which may be removed to form a transport pathway for decomposed portions of the sacrificial dielectric layer (202), through the interconnected pores defined by the porous matrix. A distinction is made between a "porous" material having pores, and a material having "voids", voids differing from pores in that voids are substantially unoccupied by solid material, whereas pores may or may not be so occupied.

Some preferred porous matrix materials, such as those known as zeolites, have naturally occurring interconnected pores. While the term "zeolite" has been used in reference to many highly-ordered mesoporous materials, several zeolites are known as preferred dielectric materials, such as mesoporous silica and aluminosilicate zeolite materials, each of which has a thermal decomposition temperature over 500 degrees, Celsius. In another embodiment a polymeric material comprising polystyrene, having a thermal decomposition temperature of about 375 degrees Celsius, polymethylmethacrylate ("pMMA"), having a thermal decomposition temperature of about 330 degrees Celsius, aromatic polycarbonate, having a thermal decomposition temperature over 440 degrees Celsius, aromatic polyimide, having a thermal decomposition temperature over 440 degrees Celsius, or silsesquioxanes such as methyl silsesquioxane ("MSQ") or hydrogen silsesquioxane ("HSQ"), each of which has a thermal decomposition temperature above 500 degrees Celsius, may be formed into porous matrix. While single-phase polymers by themselves generally do will not form interconnected pores, several preferred techniques are available to do so. In one embodiment, porogen particles having one dimension larger than the desired matrix film thickness may be used to ensure transport channeling across a polymer matrix. In another embodiment, modifications to the surface chemistry of a porogen material, or the inherent surface chemistry of porogen materials such as fumed silica, may produce an aggregated structure with high interconnectivity of porogens. In another embodiment, a polymer matrix may be combined with a sufficient amount of porogen such that the porogen will define pore interconnectivity within a polymer matrix. It is known, for example, that porogen loading greater than about 30% by weight percentage is likely to result in pore interconnectivity. Pores defined by the matrix may have sizes varying from about 5 angstroms to about 100 nanometers in diameter, depending upon the size of the porogen in the case of most non-zeolite combinations. To facilitate the formation of other adjacent layers with substantially uniform surfaces, pores larger than 10 nanometers in diameter may not be desired.

In one embodiment, the sacrificial porogen may be selectively decomposed and removed from the porous matrix of the second dielectric layer on the basis of differences in thermal decomposition temperatures between the porous matrix material and the sacrificial porogen. For example, a pairing of a sacrificial porogen chosen from the group consisting of branched poly(p-xylene), linear poly(p-phenylene), linear polybutadiene, and branched polyethylene, which have thermal decomposition temperatures of about 425-435 degrees C., about 420-430 degrees C., about 400-410 degrees C., and about 400-410 degrees C., respectively, and a porous matrix material having a higher thermal decomposition temperature, suitable candidates comprising cross-linked poly (phenylene), poly(arylether), aromatic polyimides, and aromatic polycarbonates, each of which has a thermal decomposition temperature above 440 degrees C., may contribute to selective removal of a thermally decomposed sacrificial porogen, or a "porogen decomposition", as facilitated, for example, by introduction of an oxygen or hydrogen rich carrier plasma to carry away the decomposition, as is known to those skilled in the art as a standard plasma enhanced carrier technique. Removal may also occur as a byproduct of decomposition, as in the scenario wherein gases carrying portions of a porogen decomposition may be exhausted away from the second dielectric layer given an available gradient pathway. Other suitable materials for use as sacrificial porogens, along with their respective thermal decomposition temperatures, include but are not limited to: Poly(ethylene terephthalate) ("PET")—about 300 degrees C., Polyamide-6,6 ("Nylon 6/6")—about 302 degrees C., Syndiotactic polystyrene ("PS-syn")—about 320 degrees C., Poly(e-caprolactone)—about 325 degrees C., Poly(propylene oxide) ("PPO")—about 325-375 degrees C., Polycarbonates—about 325-375 degrees C., Poly(phenylene sulfide) ("PPS")—about 332 degrees C., Polyamideimide ("PAI")—about 343 degrees C., Polyphthalamide ("PPA", "Amodel")—about 350 degrees C., Poly(a-methylstyrene) ("PMS")—about 350-375 degrees C., Poly(ether ether ketone) ("PEEK")—about 399 degrees C., Poly(ether sulfone) ("PES")—about 400 degrees C., Poly(ether ketone) ("PEK")—about 405 degrees C. Subsequent to thermal decomposition and removal of decomposed porogen material, the preferred result is a porous matrix interconnected pore pathway for subsequent supercritical carbon dioxide introduction to the sacrificial dielectric layer. Thermal decomposition may be facilitated using conventional equipment, such as a furnace or oven. Depending upon the materials selected, plasma tools may be appropriate as well, as would be apparent to one skilled in the art.

Figure 2D:
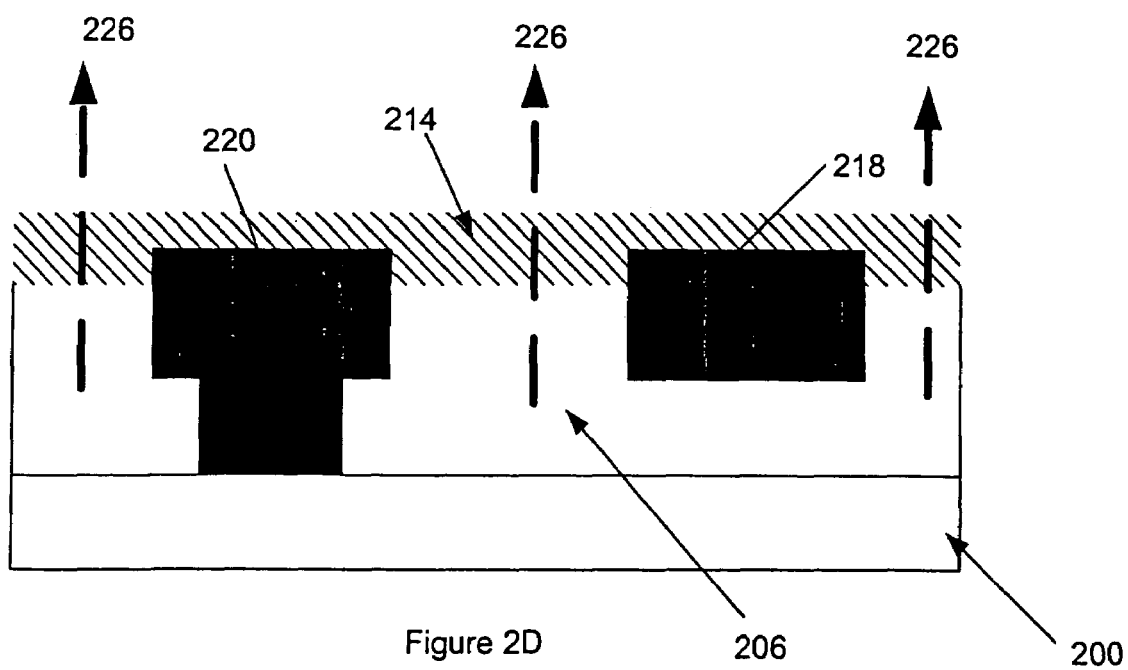

In another embodiment, a sacrificial porogen may be selectively decomposed and removed from the porous matrix on the basis of chemical agent selectivity to the sacrificial porogen. In one variation of such an embodiment, the sacrificial porogen comprises a material such as a highly-fluorinated or siloxane-based polymer which is soluble in supercritical carbon dioxide, while the porous matrix material is substantially insoluble in supercritical carbon dioxide, to enable decomposition and removal of both a portion of the sacrificial porogen and a portion of the sacrificial dielectric layer in the same supercritical carbon dioxide exposure treatment, without substantial effect to the porous matrix material, the result of which is depicted in FIG. 2D. Suitable materials include but are not limited to poly(vinylidene fluoride), poly(tetrafluoroethylene), perfluoro(meth)acrylates, and poly(dimethyl siloxane). Perfluoropolyethers, highly-branched p-FOA, or block copolymers such as pFOA-b-MMA may be used as porogens, for example, and paired with an MSQ matrix, through which portions of the porogen and sacrificial dielectric layer material may be removed using supercritical carbon dioxide. Block copolymers have been used extensively in applications such as removable emulsifiers in supercritical carbon dioxide, and detergent ingredients for supercritical carbon dioxide based textile dry cleaning.

Referring to FIG. 2D, the volume (206) previously occupied by the sacrificial dielectric layer (202 of FIGS. 2A-2C) is at least partially vacant of solids, defining at least one void which provides desirable dielectric properties as a result of the vacancy. The porous matrix material of the second dielectric layer (210 of FIGS. 2A-2C) remains intact, and the modified second dielectric layer (214) that it comprises defines voids, or interconnected pores at least partially vacant of solids, from which portions of the sacrificial porogen have been decomposed and removed. The arrows (226) in FIG. 2D depict possible pathways for removal of decomposed dielectric materials through vacated interconnected pores or voids. The resultant voids defined by the modified second dielectric layer (214) contribute to preferred dielectric properties surrounding the conductive layers (218, 220).

Summarizing the transformation of the depicted embodiment from that shown in FIG. 2C to that of FIG. 2D, supercritical carbon dioxide may be introduced to the intact second dielectric layer, where it decomposes and carries away the $scCO_2$-soluble sacrificial porogen to leave a pathway of interconnected pores (226), through which supercritical carbon dioxide is introduced to the $scCO_2$-soluble sacrificial dielectric layer. The supercritical carbon dioxide then decomposes at least a portion of the sacrificial dielectric layer to form a sacrificial dielectric layer decomposition, which is carried away through the interconnected pore pathway with the supercritical carbon dioxide, leaving behind at least one void in a position previously occupied by the material comprising the sacrificial dielectric layer. The decomposition and removal of sacrificial porogen and sacrificial dielectric layer material may all occur in one supercritical carbon dioxide exposure. In another embodiment, a portion of the porogen may be thermally decomposed and removed from the porous matrix material via diffusion or as facilitated by a carrier plasma, to create a pathway of interconnected voids through which supercritical carbon dioxide may be used to decompose and remove the sacrificial dielectric layer. In another embodiment, the second dielectric layer may comprise a porous matrix without a porogen, such as a zeolite material, in which case a pathway of interconnected voids is available to facilitate decomposition and removal of the sacrificial dielelctric material through such pathway.

Referring back to FIG. 2C, the depicted embodiment of the second dielectric layer (210) preferably is formed using a variety of conventional techniques, such as spin coating, chemical vapor deposition, or plasma-enhanced chemical vapor deposition. Depending upon the pore interconnectivity modality, discussed above, and associated materials, the appropriate thickness of the second dielectric layer (210) will vary. Pairings of the aforementioned preferred porogen and matrix materials are preferably deposited together using conventional spin coating or chemical vapor deposition techniques, with a deposition thickness preferably between about 5 nanometers and 100 nanometers. Zeolite materials may be synthesized by an aerogel or xerogel process, spin-coated into place, or deposited using chemical vapor deposition to form a porogen-free porous structure upon deposition. In the case of spin coating or other deposition methods, solvent may need to be removed using evaporative techniques familiar to those skilled in the art.

Figure 2E:
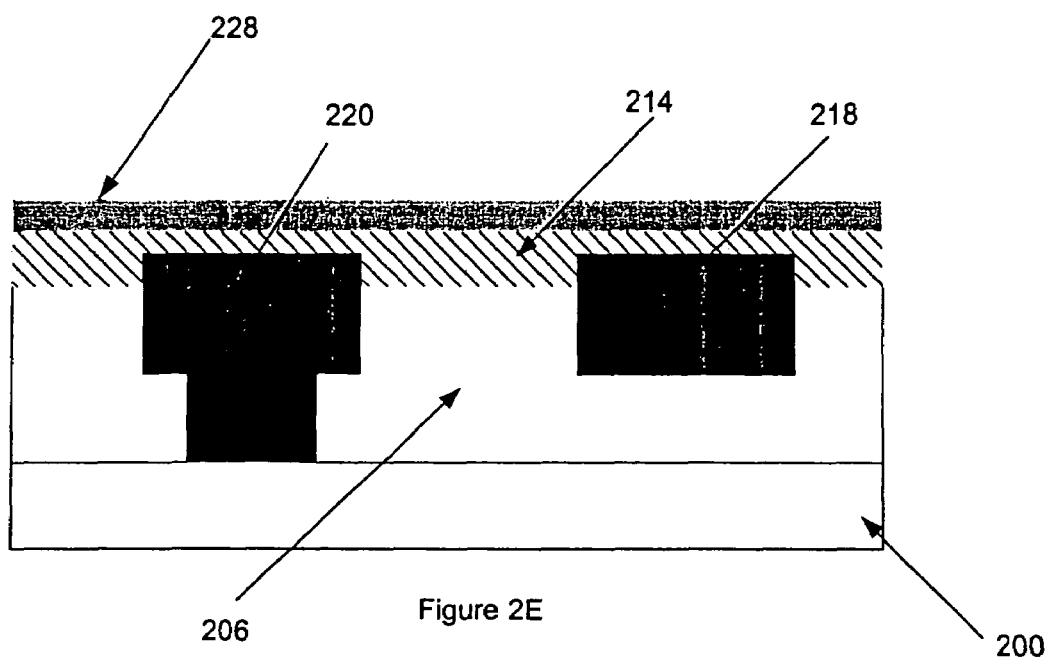

Referring to FIG. 2E, a sealing layer (228) may be deposited adjacent the transformed second dielectric layer (214) to isolate the transformed second dielectric layer (214) from other subsequently formed layers, to provide a relatively uniform surface onto which other surfaces may be more homogeneously formed, as compared with the porous matrix comprising the transformed second dielectric layer (214), and/or to help retain gases, such as nitrogen or argon and/or other inert gases to prevent oxidation or corrosion, which may be injected into or trapped within the adjacent layers (206, 214). Preferred sealing layer (228) materials comprise conventional spin-on glass and spin-on polymeric dielectric materials, and chemical-vapor-deposited films such as silicon nitride and silicon carbide, the sealing layer (228) being deposited in a layer of thickness between about 5 nanometers and about 100 nanometers, preferably between about 10 nanometers and about 50 nanometers.

Figure 2F:
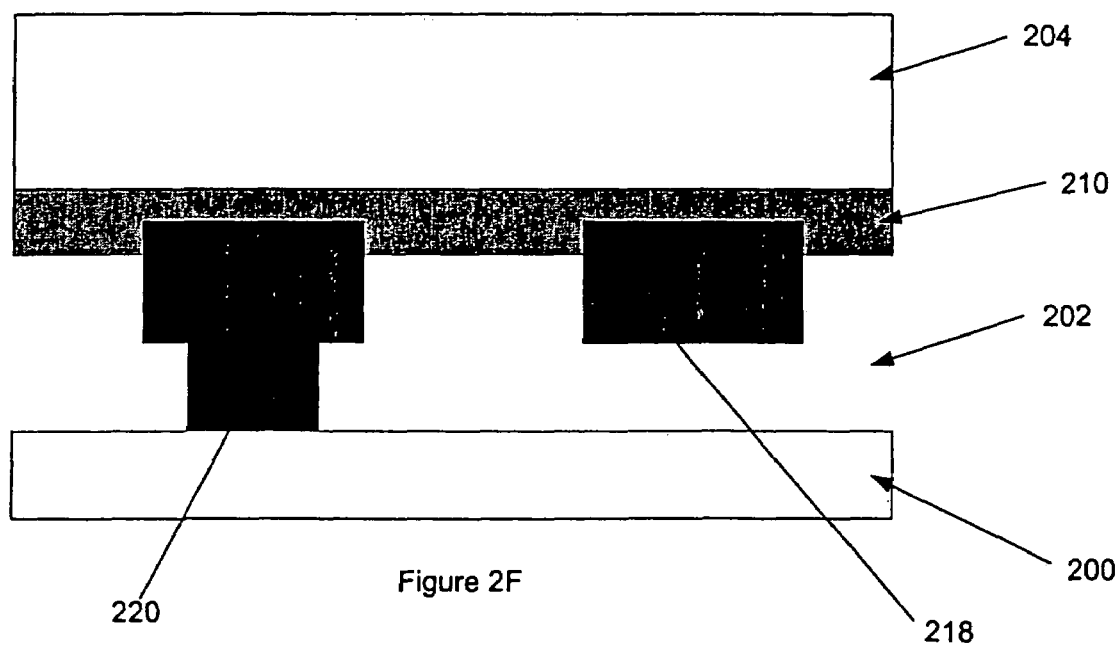
Figure 2G:
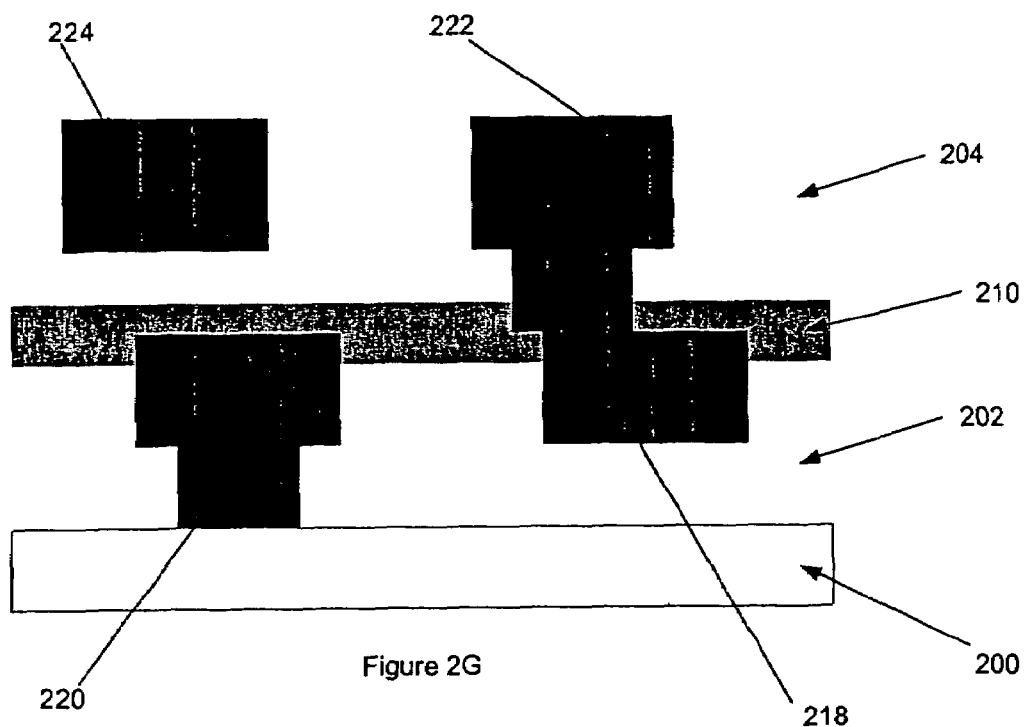
Figure 2H:
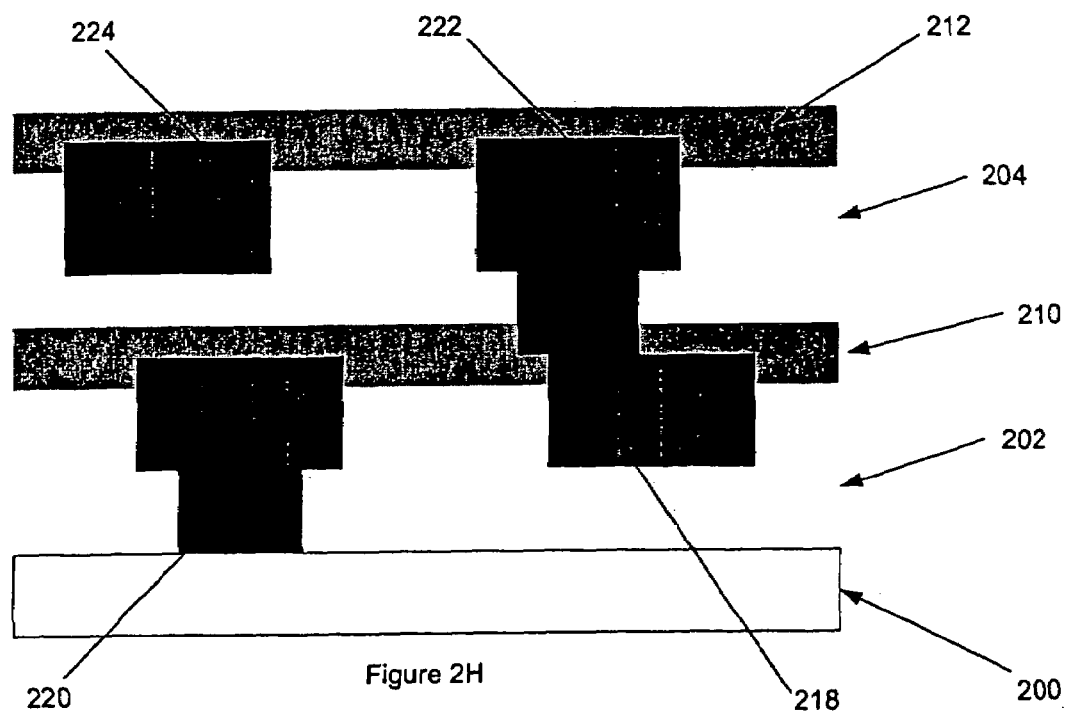

FIGS. 2F-2H illustrate an embodiment which continues from the structure depicted in FIG. 2C. FIGS. 2F-2H depict an embodiment of the invention wherein additional sacrificial layers are added to the structure before decomposition and/or transformation of the layers using supercritical carbon dioxide. In other words, FIGS. 2F-2H depict an embodiment wherein supercritical carbon dioxide is introduced to a structure having multiple intact sacrificial layers to handle all of the transformation in a single scCO$_2$ introduction, as opposed to supercritical carbon dioxide transformation of each layer separately and sequentially after each layer or set of layers (202, 218, 220, and 210 in FIG. 2C, for example) is completed, as described and illustrated in reference to FIGS. 2D and 2E. Referring to FIG. 2F, a structure similar to that of FIG. 2C is shown, with the exception that another sacrificial dielectric layer (204) has been deposited adjacent the intact second dielectric layer (210). Similarly, FIGS. 2G and 2H parallel FIGS. 2B and 2C, in that additional conductive layers (222, 224) are formed, for descriptive convenience, using similar processes and materials, adjacent to which another dielectric layer (212) similar to the second dielectric layer (210) of FIG. 2C is formed. The additional layers added with the processes illustrated in FIGS. 2F-2H need not parallel those of FIGS. 2A-2C in terms of materials, dimensions, or formation techniques, and many permutations and combinations of the disclosed aspects of the structures and methods, as well as variations thereof, are within the intended scope of the invention. Referring to FIG. 2H, the depicted structure has two intact sacrificial layers (202, 204) and two other dielectric layers (210, 212) comprising sacrificial porogens positioned within the interconnected pores of porous matrix materials making up the two dielectric layers (210, 212), the sacrificial layers and sacrificial porogens all being soluble in supercritical carbon dioxide.

Figure 2I:
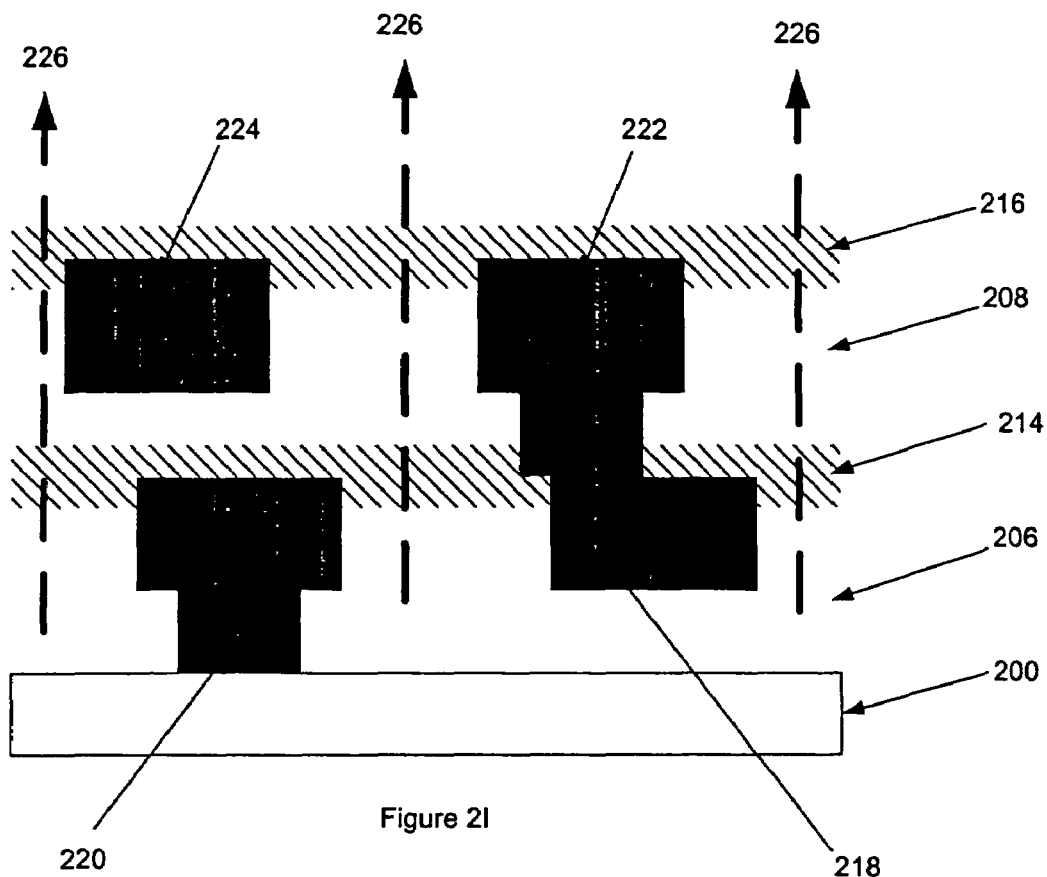
Figure 2J:
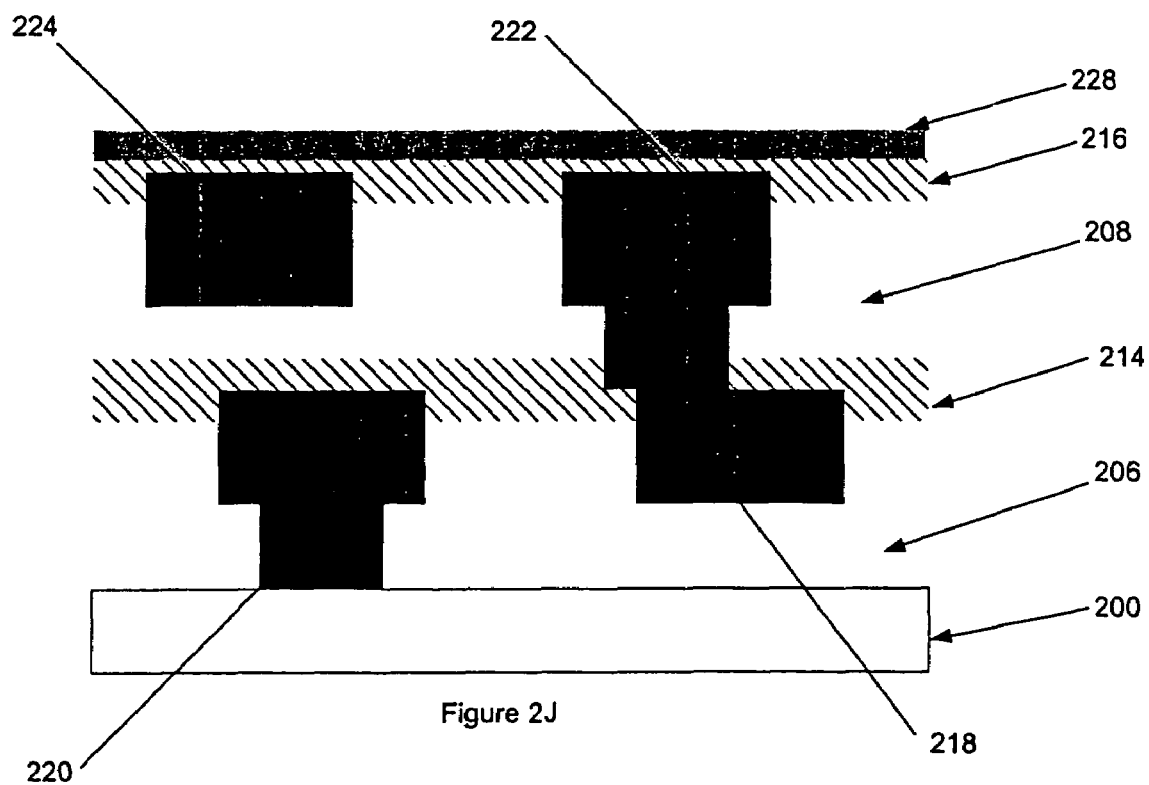

FIG. 2I depicts the result of supercritical carbon dioxide exposure to the structure depicted in FIG. 2H. Porogen decompositions and sacrificial dielectric layer decompositions have exited the structure along pathways through the interconnected pores of the remaining porous matrix, such as the pathways illustrated by the arrows (226) in FIG. 2G, to leave behind two layers (206, 208), each of which substantially comprises at least one void, and two other layers (214, 216), each of which comprises a porous matrix having interconnected pores, at least some of which remain vacated of solid material. Given the highly-penetrating nature of supercritical carbon dioxide, associated with its very low viscosity and surface tension, in addition to appropriately selected sacrificial materials to comprise the sacrificial dielectric layers (202, 204) and the sacrificial porogen which may comprise the other dielectric layers (214, 216), more than about 80 % of such sacrificial materials may be removed, resulting in relatively large volumes unoccupied by solids in the positions previously occupied by such sacrificial materials. Referring to FIG. 2J, a sealing layer (228) similar to that depicted in FIG. 2E is formed adjacent the transformed dielectric layer (216).

Figure 3A:
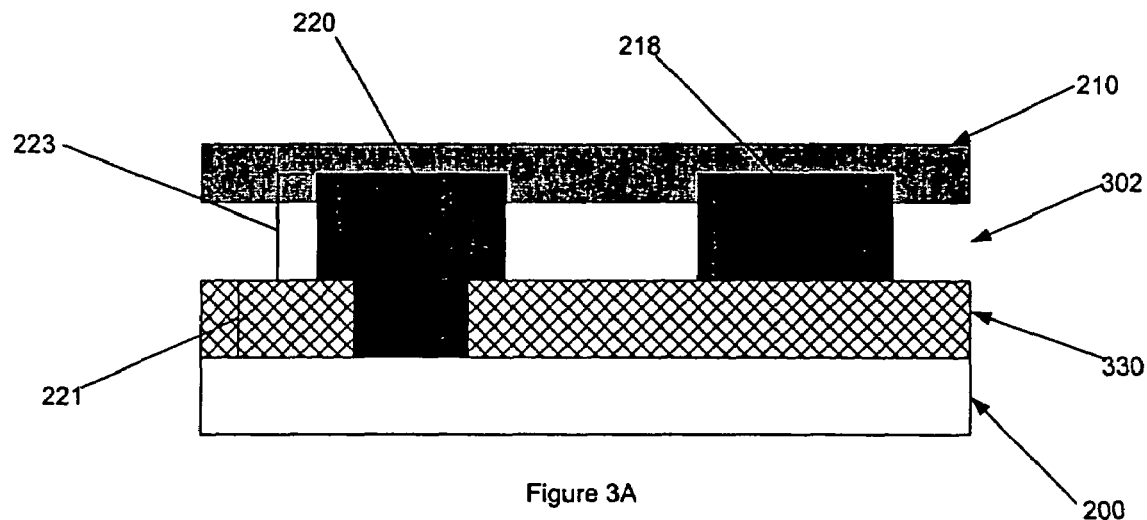
FIGS. 3A-3B depict cross-sectional views of various aspects of another embodiment of the present invention incorporating an additional dielectric layer between the sacrificial dielectric layer and the substrate.
Figure 3B:
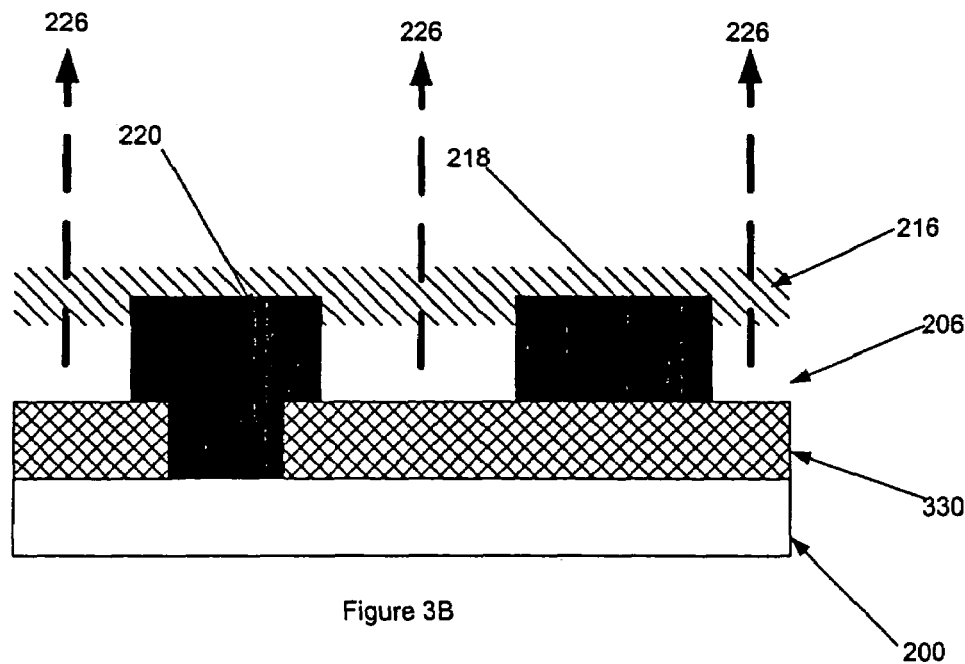

Referring to FIGS. 3A and 3B, another embodiment of the present invention is depicted, this embodiment being similar to that of FIGS. 2C and 2D, with the exception that it has a third dielectric layer (330) formed between the sacrificial dielectric layer (302) and the substrate layer (200). The third dielectric layer (330) may comprise any material that may insulate one conductive layer from another. It preferably comprises a dielectric material not substantially soluble in supercritical carbon dioxide and is positioned to support the conductive layers (218, 220) and other surrounding structures subsequent to introduction of supercritical carbon dioxide and concomitant removal of a portion of the sacrificial dielectric layer (302) to form at least one void in its previous position (206), and transformation of the second dielectric layer (210) to a layer (210) having at least some interconnected pores which are vacant of solids. In the case of a porogen material for the second dielectric layer (210) which is thermally decomposed, the material comprising the third dielectric layer (330) preferably has a higher thermal decomposition temperature as compared with the porogen material. As shown in FIG. 3A, the illustrative embodiment of the third dielectric layer (330) is located adjacent the via portion (221) of the conductive layer, while the line portion (223) is adjacent the sacrificial dielectric layer (302). Such a configuration adds sustained mechanical integrity to the relatively narrow via portion, and also provides desirable insulative properties most closely adjacent the line portion (223) of the conductive layer. An additional non-scCO2 soluble dielectric layer such as that depicted in FIGS. 3A and 3B maybe added to structures such as those depicted in FIGS. 2F-2J for added structural integrity.

The third dielectric layer (330) may comprise silicon dioxide (either undoped or doped with phosphorus or boron and phosphorus); silicon nitride; silicon oxy-nitride; porous oxide; an organic containing silicon oxide; or a polymer. Silicon dioxide, silicon nitride, and silicon oxy-nitride preferably have relatively high mechanical strength characteristics as compared with many suitable porous matrix materials. Also preferred are polymers or carbon doped oxides, as further described below, with a low dielectric constant: preferably less than about 3.5 and more preferably between about 1.5 and about 3.0. The third dielectric layer (330) may also comprise may comprise an organic polymer selected from the group consisting of polyimides, parylene, polyarylethers, organosilicates, polynaphthalenes, and polyquinolines, copolymers thereof, or other polymers not soluble in supercritical carbon dioxide. For example, commercially available polymers sold by Honeywell Corporation and Dow Chemical Corporation under the trade names FLARE™ and SiLK™, respectively, may be used to form the third dielectric layer (330).

The third dielectric layer (330) may alternatively comprise a compound having the molecular structure $Si_xO_yR_z$, in which R is selected from the group consisting of hydrogen, carbon, an aliphatic hydrocarbon and an aromatic hydrocarbon. When "R" is an alkyl or aryl group, the resulting composition is often referred to as carbon-doped oxide ("CDO"). When the third dielectric layer (330) comprises a carbon-doped oxide, it preferably comprises between about 5 and about 50 atom % carbon. More preferably, such a compound includes about 15 atom % carbon.

Examples of other types of materials that may be used to form the third dielectric layer (330) include zeolites, aerogel, xerogel, and spin-on-glass ("SOG"). In addition, the third dielectric layer (330) may comprise either hydrogen silsesquioxane ("HSQ"), methyl silsesquioxane ("MSQ"), or other materials having the molecular structure specified above, which may be coated onto the surface of a semiconductor wafer using a conventional spin coating process. Although spin coating may be a preferred way to form the third dielectric layer (330) for some materials, for others chemical vapor deposition, plasma enhanced chemical vapor deposition, a SolGel process, or foaming techniques may be preferred.

The third dielectric layer (330) may also comprise a porous matrix, or a porous matrix and removable porogen combination, analogous to those described above in reference to the dielectric layers (210, 212) of FIGS. 1 and 2. Should a porogen material of a second dielectric layer, a sacrificial dielectric material, and a porogen material of a third dielectric layer all be soluble in supercritical carbon dioxide, a single supercritical carbon dioxide exposure may be used for decomposition and removal thereof. When the third dielectric layer (330) comprises a polymer, it is preferably formed by spin coating or chemical vapor depositing the polymer onto the surface of substrate (200), using conventional equipment and process treatments. The third dielectric layer (330) may have a thickness between about 10 nanometers and about 1000 nanometers, preferably between about 20 nanometers and about 500 nanometers. The sacrificial dielectric layer (302) depicted in FIGS. 3A and 3B may be a material similar to the materials described above in reference to FIGS. 2, the key difference between the sacrificial dielectric layer (302) of the illustrative example of FIGS. 3 and the sacrificial dielectric layer of the illustrative example of FIGS. 2 (202) being the addition of the third dielectric layer (330) adjacent the sacrificial dielectric layer (302) of FIGS. 3.

Thus, a novel dielectric solution is disclosed. Although the invention is described herein with reference to specific embodiments, many modifications therein will readily occur to those of ordinary skill in the art. Accordingly, all such variations and modifications are included within the intended scope of the invention as defined by the following claims.

The invention claimed is:

1. A microelectronic structure comprising:
   a substrate layer;
   a sacrificial dielectric layer;
   a second dielectric layer comprising a porous matrix material defining interconnected pores, the sacrificial dielectric layer being positioned between the substrate layer and the second dielectric layer; and
   at least two conductive layers, each of which extends substantially perpendicularly at least partially across a region of the sacrificial dielectric layer between the substrate layer and second dielectric layers, and each of which extends laterally, and substantially parallel to the substrate layer, over a region of the sacrificial dielectric layer;
   wherein the sacrificial dielectric layer defines one or more voids occupying more than about 80% of the volume occupied by the sacrificial dielectric layer.

2. The microelectronic structure of claim 1 wherein the porous matrix material is substantially insoluble in supercritical carbon dioxide.

3. The microelectronic structure of claim 1 wherein the second dielectric layer further comprises a porogen material residing within more than one of the interconnect pores.

4. The microelectronic structure of claim 3 wherein the porogen material is soluble in supercritical carbon dioxide.

5. The microelectronic structure of claim 3 wherein the porogen material has a lower thermal decomposition temperature than the porous matrix material.

6. The microelectronic structure of claim 3 wherein at least one diffusion pathway is formed across the second dielectric layer by interconnected pores which are not occupied by a solid.

7. The microelectronic structure of claim 3 wherein less than 80% of the interconnected pores are occupied by a solid.

8. The microelectronic structure of claim 1 further comprising a third dielectric layer positioned between the sacrificial dielectric layer and the substrate layer, the third dielectric layer comprising a material substantially insoluble in supercritical carbon dioxide.

9. The microelectronic structure of claim 1 further comprising a sealing layer positioned opposite and adjacent the second dielectric layer from the sacrificial dielectric layer, the sealing layer isolating the second dielectric layer from other layers and providing a relatively uniform surface onto which other layers may be formed.

10. The microelectronic structure of claim 1 wherein the sacrificial dielectric layer is soluble in supercritical carbon dioxide.

11. The microelectronic structure of claim 1 wherein the sacrificial dielectric layer comprises a highly-fluorinated or siloxane-based polymer.

12. The microelectronic structure of claim 11 wherein the sacrificial dielectric layer comprises a polymer from the list consisting of poly(vinylidene fluoride), poly(tetrafluoroethylene), perfluoropolyether, perfluoro(meth)acrylate, poly(dimethyl siloxane), and pFOA.

13. The microelectronic structure of claim 1 wherein the porous matrix material of the second dielectric layer comprises a polymer-based material from the list consisting of polystyrene, polymethylmethacrylate, aromatic polycarbonate, aromatic polyimide, methyl silsesquioxane, hydrogen silsesquioxane, cross-linked poly(phenylene), and poly(arylether).

14. The microelectronic structure of claim 1 wherein the porous matrix material comprises a zeolite.

15. The microelectronic structure of claim 4 wherein the porogen material comprises a supercritical carbon dioxide soluble material from the list consisting of a highly-fluorinated polymer, a siloxane-based polymer, and a block copolymer.

16. The microelectronic structure of claim 5, wherein the porogen material comprises a material from the list consisting of branched poly(p-xylene), linear poly(p-phenylene), linear polybutadiene, branched polyethylene, PET, Nylon 6/6, PS-syn, poly(e-caprolactone), PPO polycarbonate, PPS, PAI, PPA, PMS, PEEK, and PEK.

17. A microelectronic structure comprising:
   a substrate layer;
   a porous dielectric layer;
   a sacrificial dielectric layer positioned between the substrate layer and the porous dielectric layer, the sacrificial layer defining one or more voids occupying more than about 80% of the volume occupied by the sacrificial dielectric layer; and
   at least two conductive layers, wherein each of which extends substantially perpendicularly at least partially across a region of the sacrificial dielectric layer between the substrate layer and second dielectric layer, and wherein each of which extends laterally, and substantially parallel to the substrate layer, over a region of a void in the sacrificial layer.

18. The microelectronic structure of claim 17 wherein the porous dielectric layer is substantially insoluble in supercritical carbon dioxide.

19. The microelectronic structure of claim 17 wherein the porous dielectric layer further comprises a porogen material residing within more than one pores.

20. The microelectronic structure of claim 19 wherein the porogen material is soluble in supercritical carbon dioxide.

21. The microelectronic structure of claim 20 wherein the sacrificial dielectric layer is soluble in supercritical carbon dioxide.

22. A microelectronic structure comprising:
   a substrate layer;
   a porous dielectric layer;
   a sacrificial dielectric layer positioned between the substrate layer and the porous dielectric layer, the sacrificial layer including a sacrificial material and one or more voids occupying more than about 80% of the volume occupied by the sacrificial layer; and
   at least two conductive layers, wherein each of which extends substantially perpendicularly at least partially across a region of the sacrificial dielectric layer between the substrate layer and second dielectric layer, and each of which is at least partially positioned above an adjacent single void of the sacrificial layer.

23. The microelectronic structure of claim 17 wherein the porous dielectric layer is substantially insoluble in supercritical carbon dioxide.

24. The microelectronic structure of claim 17 wherein the porous dielectric layer further comprises a porogen material residing within more than one pores.

25. The microelectronic structure of claim 19 wherein the porogen material and sacrificial dielectric layer are soluble in supercritical carbon dioxide.

* * * * *